(12) United States Patent
Yamamoto

(10) Patent No.: US 11,235,495 B2
(45) Date of Patent: Feb. 1, 2022

(54) IMPRINT SYSTEM AND ARTICLE MANUFACTURING METHOD

(71) Applicant: CANON KABUSHIKI KAISHA, Tokyo (JP)

(72) Inventor: Kiyohito Yamamoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 246 days.

(21) Appl. No.: 16/432,173

(22) Filed: Jun. 5, 2019

(65) Prior Publication Data

US 2019/0283281 A1    Sep. 19, 2019

Related U.S. Application Data

(63) Continuation of application No. PCT/JP2017/042311, filed on Nov. 27, 2017.

(30) Foreign Application Priority Data

Dec. 9, 2016  (JP) .............................. JP2016-239776

(51) Int. Cl.
*B29C 33/38* (2006.01)
*B29C 59/02* (2006.01)
*H01L 21/027* (2006.01)

(52) U.S. Cl.
CPC .......... *B29C 33/3857* (2013.01); *B29C 59/02* (2013.01); *B29C 59/026* (2013.01); *H01L 21/027* (2013.01)

(58) Field of Classification Search
CPC .............. G03F 7/0002; G03F 7/70716; G03F 7/70775; B29C 59/02; B29C 59/026
See application file for complete search history.

(56) References Cited

U.S. PATENT DOCUMENTS 736,085 A    8/1903 French
7,360,851 B1    4/2008 Snyder
(Continued)

FOREIGN PATENT DOCUMENTS

JP    2012234901 A    11/2012
JP    2013175671 A    9/2013
(Continued)

OTHER PUBLICATIONS

International Search Report issued in Intl. Appln. No PCT/JP2017/042311 dated Feb. 13, 2018 English translation provided.
(Continued)

*Primary Examiner* — Joseph S Del Sole
*Assistant Examiner* — Mohamed K Ahmed Ali
(74) *Attorney, Agent, or Firm* — Rossi, Kimms & McDowell LLP

(57) ABSTRACT

A replica manufacturing apparatus performs imprint processing of forming a pattern of an imprint material on a replica substrate using a master mold, processes the replica substrate with the formed pattern to manufacture a replica mold, and transfers data of a condition concerning the imprint processing to a management apparatus. An imprint apparatus acquires the data from the management apparatus, and performs the imprint processing of forming a pattern of an imprint material on a substrate using the replica mold.

11 Claims, 8 Drawing Sheets

(56) References Cited

U.S. PATENT DOCUMENTS

| | | | |
|---|---|---|---|
| 2013/0056903 A1* | 3/2013 | Hayashi | G03F 7/0002 |
| | | | 264/293 |
| 2014/0001675 A1 | 1/2014 | Nakamura et al. | |
| 2014/0210134 A1 | 7/2014 | Wakamatsu et al. | |
| 2016/0129614 A1 | 5/2016 | Yamazaki et al. | |
| 2016/0271845 A1 | 9/2016 | Yamazaki et al. | |
| 2016/0299444 A1 | 10/2016 | Komaki et al. | |

FOREIGN PATENT DOCUMENTS

| | | | |
|---|---|---|---|
| JP | 2016092270 A | 5/2016 | |
| JP | 2016178127 A | 10/2016 | |
| TW | 201247394 A | 12/2012 | |
| TW | 201332747 A | 8/2013 | |
| TW | 201642315 A | 12/2016 | |

OTHER PUBLICATIONS

Written Opinion issued in Intl. Appln. No. PCT/JP2017/042311 dated Feb. 13, 2018.

Office Action issued in Taiwanese Appln. No. 106142506 dated Apr. 30, 2018.

\* cited by examiner

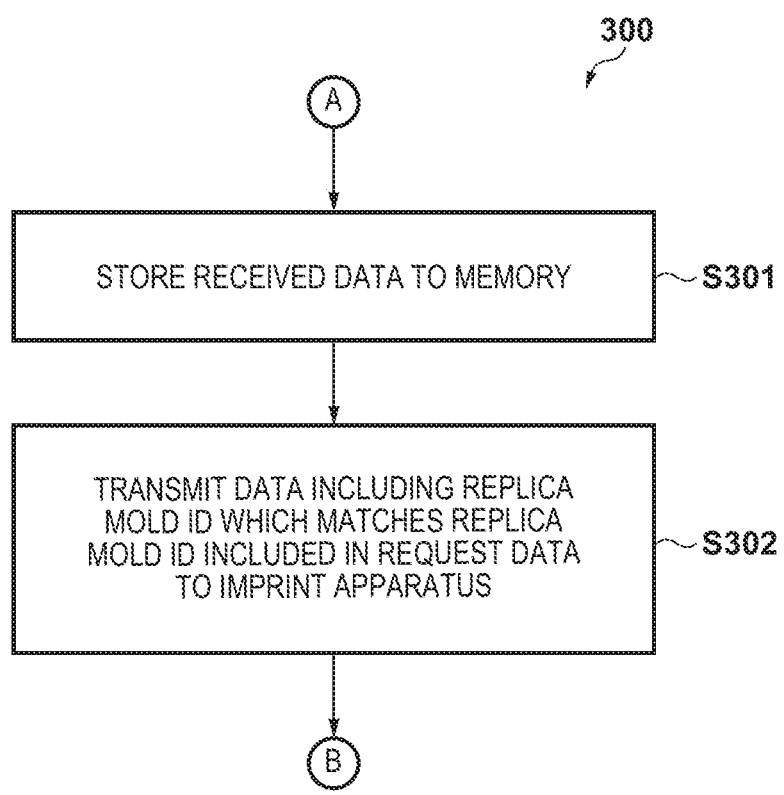

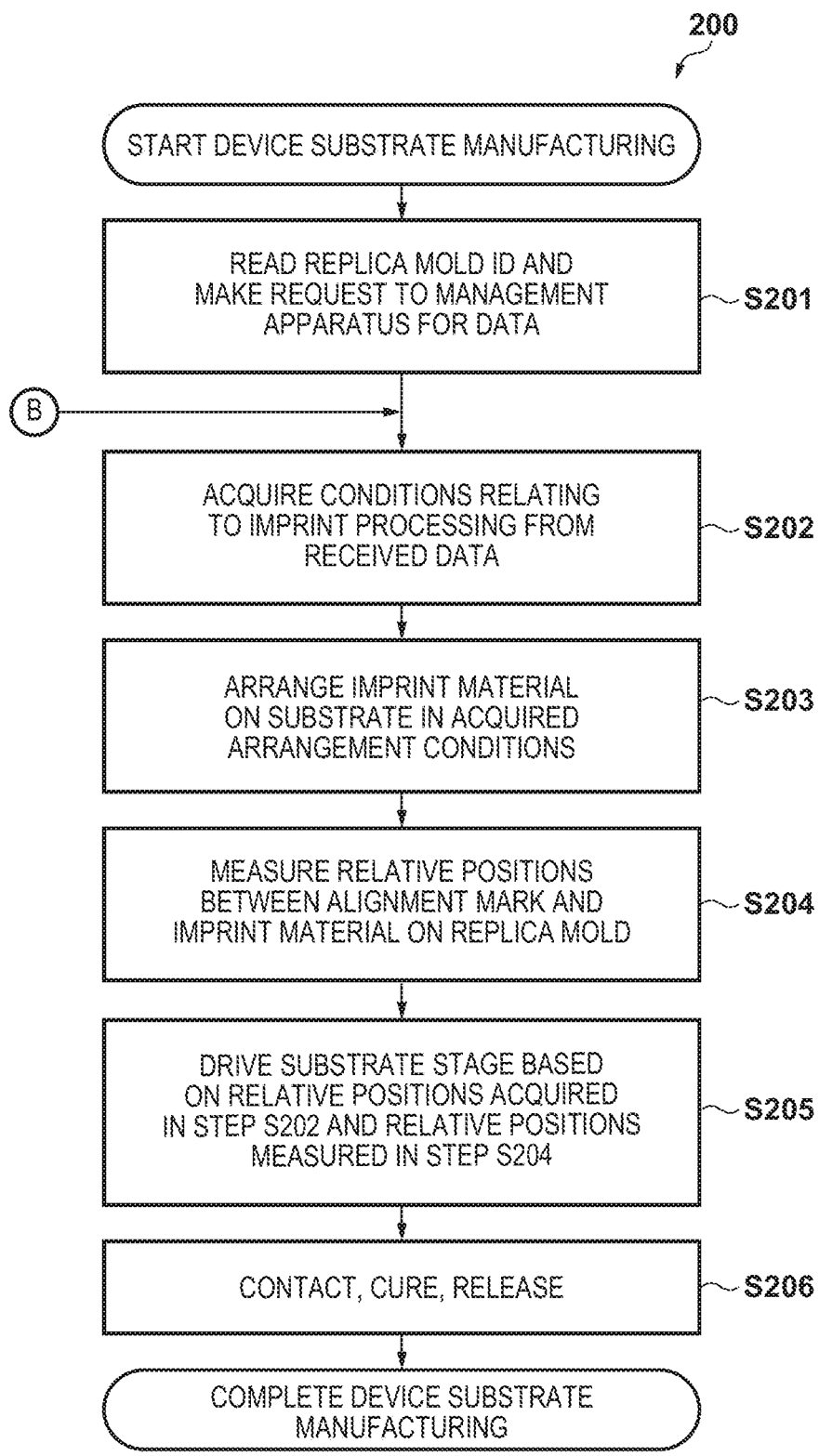

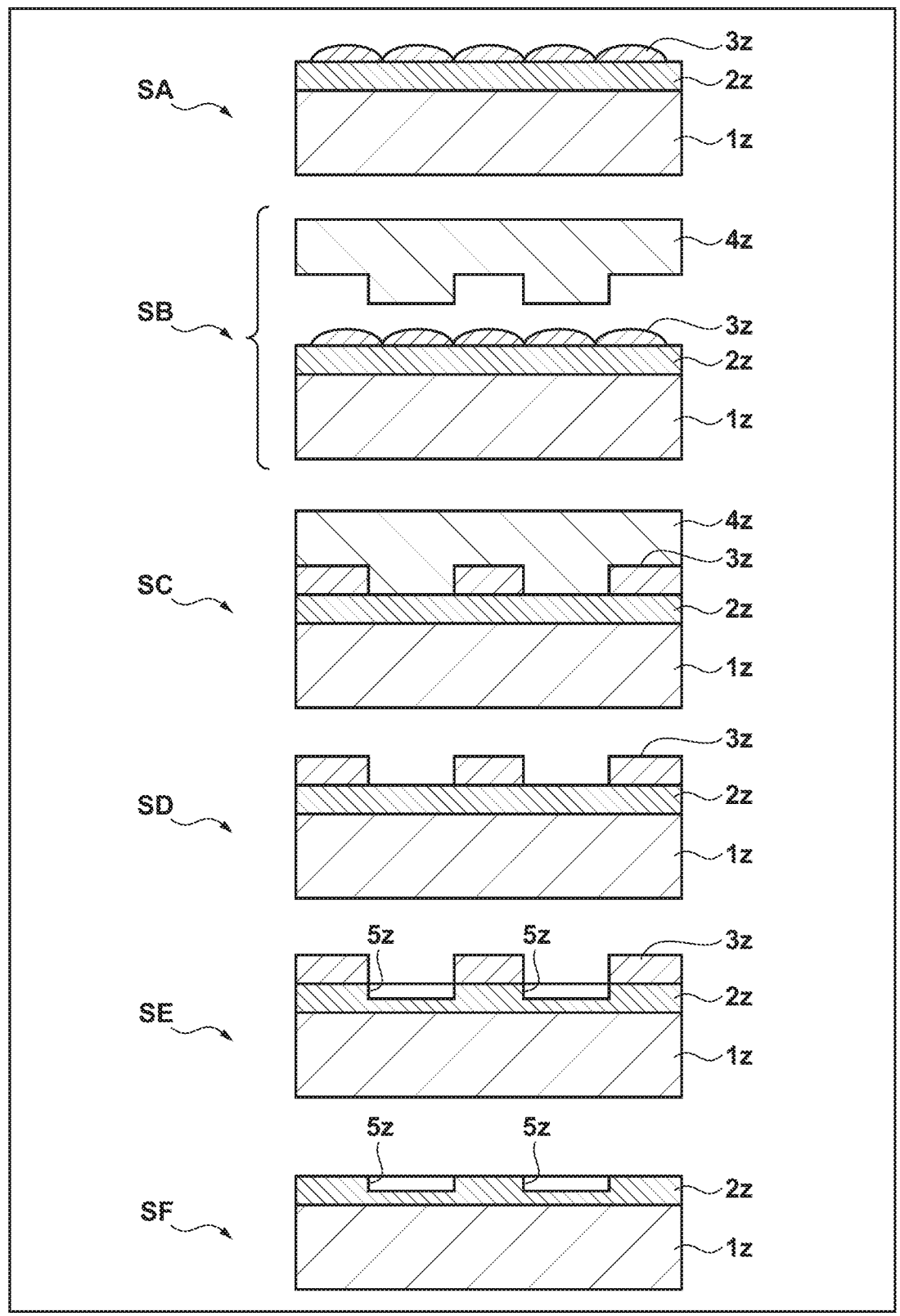

IMPRINT SYSTEM AND ARTICLE MANUFACTURING METHOD

CROSS-REFERENCE TO RELATED APPLICATIONS

This application is a Continuation of International Patent Application No. PCT/JP2017/042311, filed Nov. 27, 2017, which claims the benefit of Japanese Patent Application No. 2016-239776, filed Dec. 9, 2016, both of which are hereby incorporated by reference herein in their entirety.

BACKGROUND OF THE INVENTION

Field of the Invention

The present invention relates to an imprint system and an article manufacturing method.

Background Art

In an imprint apparatus, an imprint material supplied onto a substrate and a mold in which a pattern is formed are brought into contact with each other, and the imprint material is cured in the contact state. After that, the mold is separated from the cured imprint material, thereby forming the pattern of the imprint material on the substrate.

When manufacturing a semiconductor device using the imprint apparatus, it is important to reliably fill the pattern formed in the mold with the imprint material. For this purpose, PTL 1 proposes a technique of optimizing the arrangement layout of the imprint material in accordance with the pattern.

In addition, the imprint technique can also be used for a technique of manufacturing a replica template using a master template, as disclosed in, for example, PTL 2.

CITATION LIST

Patent Literature

PTL 1: U.S. Pat. No. 736,085
PTL 2: Japanese Patent Laid-Open No. 2013-175671

According to a conventional imprint technique, the concave/convex relationship between the pattern of a master template and the pattern of a replica template is reversed. For this reason, the concave/convex relationship of the templates is reversed between a replica manufacturing apparatus that imprints the master template and a device manufacturing apparatus (imprint apparatus) that imprints the replica template. It is therefore necessary to individually adjust conditions concerning imprint processing such as the layout of an imprint material.

SUMMARY OF THE INVENTION

The present invention provides a technique capable of easily reproducing, at the time of device manufacturing, conditions concerning imprint processing at the time of replica mold manufacturing.

According to an aspect of the present invention, there is provided an imprint system comprising a replica manufacturing apparatus configured to manufacture a replica mold using a master mold, an imprint apparatus configured to perform imprint processing of forming a pattern of an imprint material on a substrate using the replica mold, and a management apparatus communicably connected to the replica manufacturing apparatus and the imprint apparatus, wherein the replica manufacturing apparatus performs imprint processing of forming a pattern of an imprint material on a replica substrate using the master mold, processes the replica substrate with the formed pattern to manufacture the replica mold, and transfers data of a condition concerning the imprint processing to the management apparatus, and the imprint apparatus acquires the data from the management apparatus, and performs the imprint processing of forming the pattern of the imprint material on the substrate using the replica mold in accordance with the condition included in the acquired data.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2B is a flowchart for explaining the control operation of the imprint system according to the embodiment.

FIG. 2C is a flowchart for explaining the control operation of the imprint system according to the embodiment.

FIG. 6 is a view for explaining an article manufacturing method according to the embodiment.

DESCRIPTION OF THE EMBODIMENTS

Hereinafter, embodiments of the present invention will be described in detail with reference to the accompanying drawings. It should be noted that the following embodiments merely show detailed examples advantageous in implementing the present invention, and are not intended to limit the scope of the appended claims, and that not all the combinations of features described in the embodiments are necessarily essential to the solving means of the present invention.

(System Arrangement)

Figure 1:
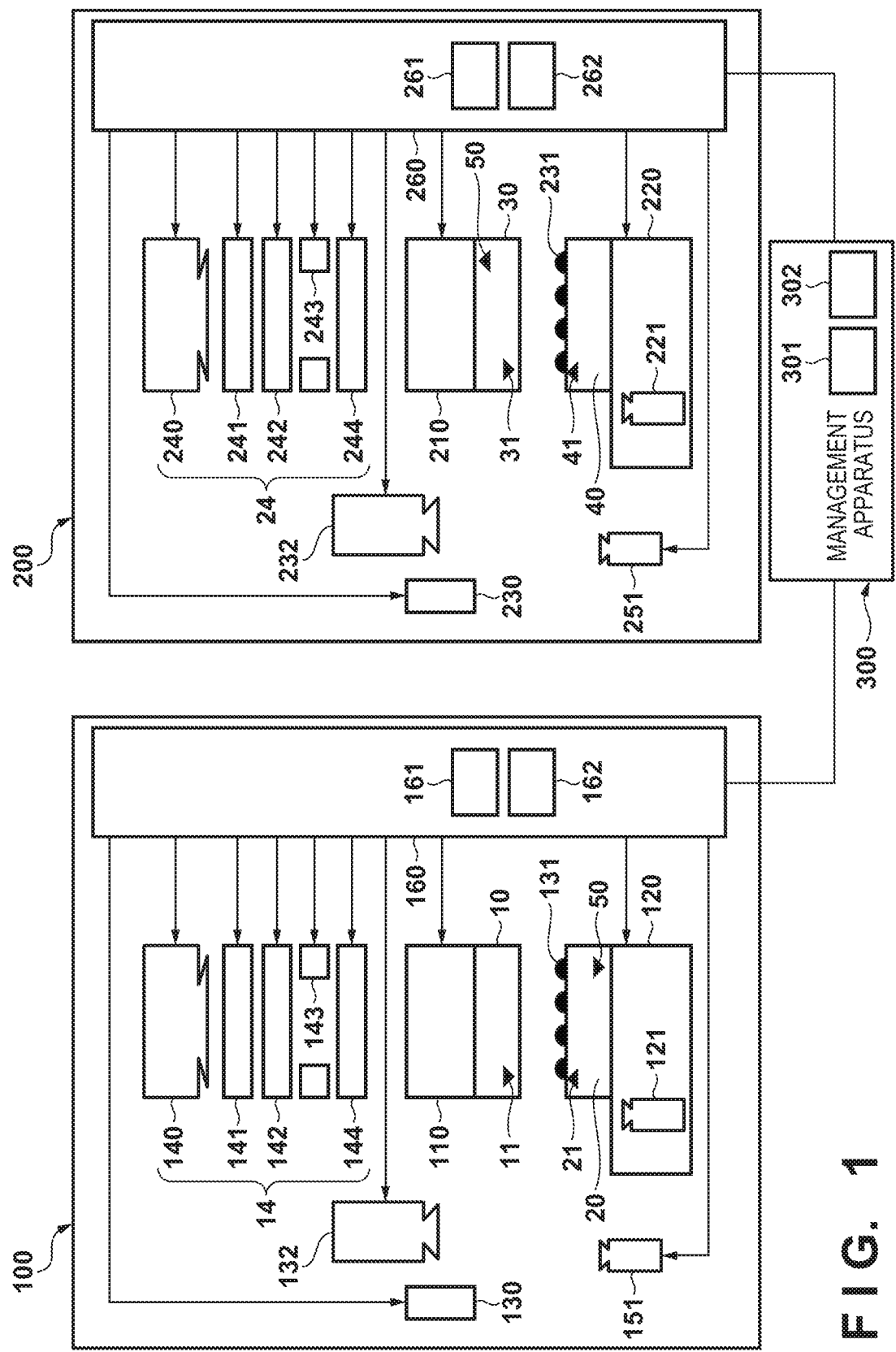
FIG. 1 is a block diagram showing the arrangement of an imprint system according to an embodiment.

FIG. 1 is a block diagram showing the arrangement of an imprint system according to this embodiment. The imprint system can include a replica manufacturing apparatus 100, an imprint apparatus 200, and a management apparatus 300. The management apparatus 300 is communicably connected to the replica manufacturing apparatus 100 and the imprint apparatus 200.

The outline of the imprint apparatus 200 will be described first. The imprint apparatus 200 is an apparatus that brings an imprint material supplied onto a substrate into contact with a mold and gives energy for curing to the imprint material, thereby forming the pattern of a cured product to which the uneven pattern of the mold is transferred.

As the imprint material, a curable composition (to be also referred to as a resin in an uncured state) to be cured by energy for curing is used. As the energy for curing, an electromagnetic wave, heat, or the like can be used. The electromagnetic wave can be, for example, light whose wavelength is selected from the range of 10 nm to 1 mm, for example, infrared rays, visible light, or UV rays. The curable composition can be a composition cured by light irradiation or heating. Of these materials, a photo-curable composition cured by light irradiation may contain at least a polymerizable compound and a photopolymerization initiator, and may further contain a nonpolymerizable compound or a solvent as needed. The nonpolymerizable compound is at least one material selected from the group consisting of a sensitizer, a hydrogen donor, an internal mold release agent, a surfactant, an antioxidant, and a polymer component. The imprint material can be supplied, by an imprint material supply device, onto a substrate in a droplet shape or in an island or film shape formed by connecting a plurality of droplets. The viscosity (viscosity at 25° C.) of the imprint material is, for example, 1 mPa·s to 100 mPa·s. As the material of the substrate, for example, glass, ceramic, a metal, a semiconductor, a resin, or the like can be used. A member made of a material different from that of the substrate may be provided on the surface of the substrate, as needed. The substrate is, for example, a silicon substrate, a semiconductor compound substrate, silica glass, or the like.

In this embodiment, the imprint apparatus 200 employs a photo-curing method of curing the imprint material by irradiation of UV rays. However, the method is not limited to this, and a heat-curing method of curing the imprint material by heat input.

In the imprint apparatus 200, a substrate stage 220 is configured to hold a substrate 40 and move. A dispenser 230 that constitutes the above-described imprint material supply device supplies (arranges) an imprint material 231 on the substrate 40 held by the substrate stage 220. An imprint head 210 can include a driving mechanism configured to hold a mold 30 and bring the mold 30 into contact with the imprint material 231 on the substrate 40.

A curing unit 24 that irradiates the imprint material 231 on the substrate 40 with UV rays through the mold 30 to cure the imprint material 231 can include a light source unit 240, a wavelength selection unit 241, a light attenuation unit 242, a slit mechanism 243, and a light amount measurement unit 244. The light source unit 240 includes a light source that generates UV rays used to cure the imprint material 231. For the light source, for example, a high-pressure mercury lamp, a xenon lamp, an excimer laser, or the like can be used. The wavelength selection unit 241 can include, for example, a plurality of wavelength filters configured to pass light beams of wavelengths different from each other, and a mechanism that inserts/removes one wavelength filter selected from the plurality of wavelength filters into/from the optical path. The light attenuation unit 242 can include, for example, a plurality of ND filters, and a mechanism that inserts/removes one ND filter selected from the plurality of ND filters into/from the optical path. The slit mechanism 243 can include, for example, a light shielding blade that defines the shape of an illumination region, and a driving mechanism that drives the light shielding blade. The light amount measurement unit 244 can include a UC sensor and measure the amount of irradiation light from the light source unit 240.

An alignment scope 232 is a microscope configured to perform alignment between the mold 30 and the substrate 40 after the imprint material 231 is arranged on the substrate 40 by the dispenser 230. The alignment scope 232 measures the overlay state between an alignment mark 31 provided on the mold 30 and an alignment mark 41 provided on the substrate 40, thereby performing mutual alignment. The alignment scope 232 can also acquire the relative position shift information between the alignment mark 31 provided on the mold 30 and the imprint material 231 arranged on the substrate 40. In addition, identification information (ID) is formed on the mold 30, and this can be read by a reading unit 251. In addition, the imprint apparatus 200 can include an image capturing unit 221 configured to observe a state when bringing the mold 30 into contact with the imprint material 231 on the substrate 40 and when performing mold release. Referring to FIG. 1, the image capturing unit 221 is provided on the side of the substrate stage 220 and captures an image from the reverse surface side of the substrate. Conversely, the image capturing unit 221 may be provided on the side of the imprint head 210 and may capture an image from the obverse surface side of the mold.

A control unit 260 includes, for example, a CPU 261 and a memory 262 and controls each unit of the imprint apparatus 200. For example, the control unit 260 performs imprint processing in the following way. First, the imprint material 231 is arranged on the substrate 40 by the dispenser 230. After that, the mold 30 is moved down by the imprint head 210 and brought into contact with the imprint material 231 on the substrate 40. Accordingly, the imprint material 231 flows into the grooves of the pattern formed on the mold 30. In this state, the curing unit 24 is caused to irradiate the imprint material 231 with UV rays, thereby curing the imprint material 231. When the imprint material 231 is cured, the pattern (circuit pattern) of the mold 30 by the imprint material 231 is formed. After the imprint material 231 is cured, the mold 30 is moved up by the imprint head 210, thereby separating the mold 30 from the cured imprint material 231 (mold release). Imprint processing in this embodiment is as described above in general.

Note that in the imprint apparatus 200 according to this embodiment, the imprint head 210 is driven to bring the mold into contact with the imprint material 231 on the fixed substrate 40. However, a reverse arrangement is also possible. That is, the substrate stage 220 may be driven to bring the imprint material 231 on the substrate 40 into contact with the fixed mold 30. Alternatively, both the imprint head 210 and the substrate stage 220 may be driven up and down. That is, the imprint apparatus need only include a driving unit configured to change the relative position between the mold 30 and the substrate 40.

In a case in which the imprint apparatus 200 as described above is applied to the manufacture of a semiconductor device, degradation caused by repetitive use of the mold 30 can be a problem. In this embodiment, it is assumed that an inexpensive replica mold is manufactured as needed from an expensive master mold that is an original, and the imprint apparatus 200 uses the replica mold as the mold 30. The replica manufacturing apparatus 100 is an apparatus that manufactures the replica mold.

The basic arrangement of the replica manufacturing apparatus 100 is almost the same as the imprint apparatus 200. In the replica manufacturing apparatus 100, a substrate stage 120 is configured to hold a replica substrate 20 and move. A dispenser 130 arranges an imprint material 131 on the replica substrate 20 held by the substrate stage 120. An imprint head 110 can include a driving mechanism configured to hold a mold 10 that is a master mold and bring the mold 10 into contact with the imprint material 131 on the replica substrate 20. A curing unit 14 cures the imprint material 131 on the replica substrate 20.

The curing unit 14 that irradiates the imprint material 131 on the replica substrate 20 with UV rays through the mold 10 to cure the imprint material 131 can include a light source unit 140, a wavelength selection unit 141, a light attenuation unit 142, a slit mechanism 143, and a light amount measurement unit 144. The light source unit 140 includes a light source that generates UV rays used to cure the imprint material 131. For the light source, for example, a high-pressure mercury lamp, a xenon lamp, an excimer laser, or the like can be used. The wavelength selection unit 141 can include, for example, a plurality of wavelength filters configured to pass light beams of wavelengths different from each other, and a mechanism that arranges a wavelength filter selected from the plurality of wavelength filters into the optical path between the light source and the mold. The light attenuation unit 142 can include, for example, a plurality of ND filters, and a mechanism that inserts/removes one ND filter selected from the plurality of ND filters into/from the optical path. The slit mechanism 143 can include, for example, a light shielding blade that defines the shape of an illumination region, and a driving mechanism that drives the light shielding blade. The light amount measurement unit 144 can include a UC sensor and measure the amount of irradiation light from the light source unit 140.

An alignment scope 132 is a microscope configured to perform alignment between the mold 10 and the replica substrate 20 after the imprint material 131 is arranged on the replica substrate 20 by the dispenser 130. The alignment scope 132 measures the overlay state between an alignment mark 11 provided on the mold 10 and an alignment mark 21 provided on the replica substrate 20, thereby performing mutual alignment. The alignment scope 132 can also acquire the relative position shift information between the alignment mark 11 provided on the mold 10 and the imprint material 131 arranged on the replica substrate 20. In addition, an ID is formed on the mold 10, and this can be read by a reading unit 151. In addition, the replica manufacturing apparatus 100 can include an image capturing unit 121 configured to observe a state when bringing the mold 10 into contact with the imprint material 131 on the replica substrate 20 and when performing mold release. Referring to FIG. 1, the image capturing unit 121 is provided on the side of the substrate stage 120 and captures an image from the reverse surface side of the substrate. Conversely, the image capturing unit 121 may be provided on the side of the imprint head 110 and may capture an image from the obverse surface side of the mold.

A control unit 160 includes, for example, a CPU 161 and a memory 162 and controls each unit of the replica manufacturing apparatus 100. For example, the control unit 160 controls the manufacture of a replica mold by the same processing as the imprint processing by the imprint apparatus 200 described above. More specifically, first, the imprint material 131 is arranged on the replica substrate 20 by the dispenser 130. After that, the mold 10 that is the master mold is moved down by the imprint head 110 and brought into contact with the imprint material 131 on the replica substrate 20. Accordingly, the imprint material 131 flows into the grooves of the pattern formed on the mold 10. In this state, the curing unit 14 is caused to irradiate the imprint material 131 with UV rays, thereby curing the imprint material 131. When the imprint material 131 is cured, the pattern (circuit pattern) of the mold 10 by the imprint material 131 is formed. After the imprint material 131 is cured, the mold 10 is moved up by the imprint head 110, thereby separating the mold 10 from the cured imprint material 131 (mold release).

Note that in the replica manufacturing apparatus 100 according to this embodiment, the imprint head 110 is driven to bring the mold into contact with the imprint material 131 on the fixed replica substrate 20. However, a reverse arrangement is also possible. That is, the substrate stage 120 may be driven to bring the imprint material 131 on the replica substrate 20 into contact with the fixed mold 10. Alternatively, both the imprint head 110 and the substrate stage 120 may be driven up and down. That is, the replica manufacturing apparatus need only include a driving unit configured to change the relative position between the mold 10 and the replica substrate 20.

The replica substrate 20 on which the circuit pattern by the imprint material 131 is thus formed undergoes etching in post-processing and is completed as a replica mold having the uneven circuit pattern. At this time, when the pattern is formed by a known reversing process, as a result, the same circuit pattern as the mold 10 that is the master mold is formed on the replica mold. Note that conditions concerning imprint processing can be optimized in accordance with the circuit pattern to be manufactured. In accordance with the circuit pattern to be manufactured, the control unit 160 selects these conditions and controls imprint processing such that the circuit pattern is formed on the replica substrate 20.

The imprint apparatus 200 can use the thus manufactured replica mold as the mold 30. As described above, when the pattern is formed by the reversing process, the same circuit pattern as the mold 10 that is the master mold is formed on the mold 30 that is the replica mold. In this embodiment, as conditions concerning imprint processing for the mold 30 that is the replica mold in the imprint apparatus 200, conditions concerning imprint processing at the time of manufacturing the replica mold in the replica manufacturing apparatus 100 can be diverted. The conditions concerning the imprint processing can include, for example, following conditions.

Arrangement conditions: Information representing the arrangement position and the arrangement amount of the imprint material 131 on the replica substrate 20. The arrangement conditions are set based on the density and the like of the circuit pattern of the mold 10 such that unfilled defects are suppressed, and the imprint material on the substrate after imprint processing has a predetermined film thickness.

Contact conditions: Pieces of information that define the operation of the driving unit such as the driving amount of the imprint head 110 when bringing the mold 10 into contact with the imprint material 131.

Irradiation conditions: Curing conditions that define the operation of the curing unit 14, which are pieces of information such as the light amount and the irradiation time of UV rays emitted from the light source unit 140.

Mold release conditions: Pieces of information that define the operation of the driving unit such as the driving amount of the imprint head 110 when separating the mold 10 from the cured imprint material 131.

When these pieces of information in the replica manufacturing apparatus 100 are diverted to the imprint apparatus 200, conditions concerning imprint processing at the time of device manufacturing can easily be decided, and the conditions at the time of replica manufacturing can be reproduced on a device.

The conditions concerning imprint processing may further include following conditions concerning the curing unit 14.

Wavelength selection conditions: Selection information of a wavelength filter in the wavelength selection unit 141.

Filter selection conditions: Selection information of an ND filter in the light attenuation unit 142.

Slit setting conditions: Setting information concerning driving of the slit mechanism 143.

When these pieces of information concerning the curing unit 14 are diverted to the imprint apparatus 200, conditions when curing the mold can be made to match between replica mold manufacturing and device manufacturing. Accordingly, the curing state of the imprint material in the replica manufacturing apparatus 100 can easily be reproduced in the imprint apparatus 200.

The management apparatus 300 stores data including the above-described various kinds of conditions concerning imprint processing at the time of replica mold manufacturing in the replica manufacturing apparatus 100, and transfers the data to the imprint apparatus 200 in response to a request from the imprint apparatus 200. The management apparatus 300 may also transfer the light amount measurement result by the light amount measurement unit 144 to the imprint apparatus 200. Accordingly, the imprint apparatus 200 can adjust the selection conditions of the light attenuation unit 242, the irradiation time of the light source unit 240, and the like. The management apparatus 300 can be implemented by, for example, a computer apparatus including a CPU 301 and a memory 302.

(Relative Position Offset)

When diverting the conditions concerning imprint processing in the replica manufacturing apparatus 100 to the imprint apparatus 200, a shift in the positional relationship between the substrate and the imprint material arranged on it may occur in the imprint processing of the two apparatuses (relative position offset). Hence, in this embodiment, such a positional relationship can be corrected. Driving of the substrate stage 220 using the relative position offset will be described below with reference to FIG. 3.

Figure 3:
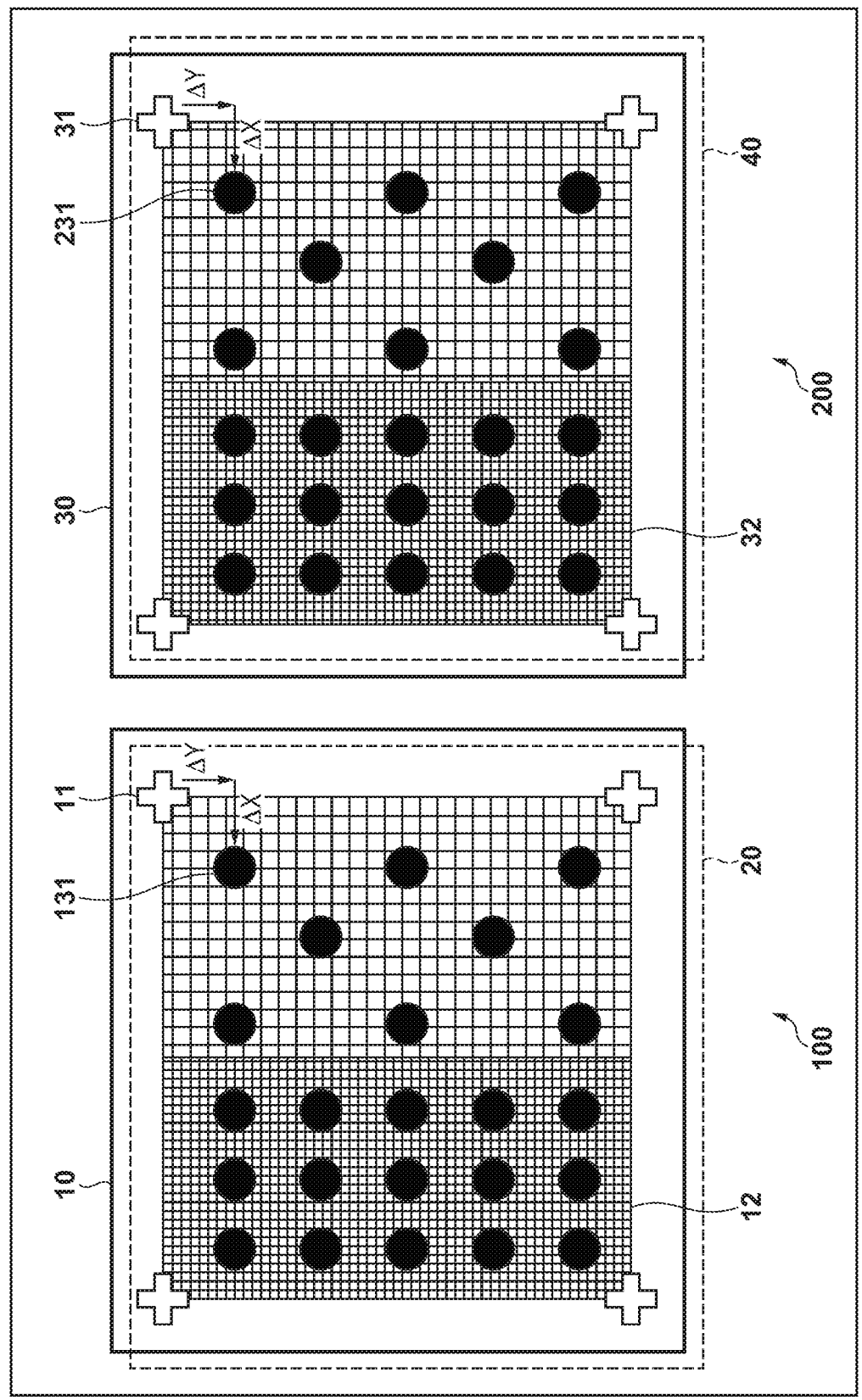
FIG. 3 is a view for explaining driving of a substrate stage using relative position offsets.

The left view of FIG. 3 shows an example of the positional relationship between the mold 10, the replica substrate 20, and the imprint material 131 on that at the time of replica mold manufacturing by the replica manufacturing apparatus 100. The alignment marks 11 and a circuit pattern 12 are formed on the mold 10. The imprint material 131 represented by full circles is arranged on the replica substrate 20 by the dispenser 130 (first supply unit). Relative positions ΔX and ΔY between the alignment mark 11 and the imprint material 131 arranged by the dispenser 130 are measured by the alignment scope 132 (first measurement unit). The relative positions ΔX and ΔY measured here are relative position offsets.

The right view of FIG. 3 shows an example of the positional relationship between the mold 30 (replica mold), the substrate 40, and the imprint material 231 on that in the imprint apparatus 200. The alignment marks 31 corresponding to the alignment marks 11 of the mold 10 that is the master mold and a circuit pattern 32 corresponding to the circuit pattern 12 are formed on the mold 30. If the alignment marks 31 are formed by transferring the alignment marks 11 of the mold 10 that is the master mold, the relative positions between the alignment marks 31 and the circuit pattern 32 are the same as the relative positions between the alignment marks 11 and the circuit pattern 12. The relative positions ΔX and ΔY between the alignment mark 31 and the imprint material 231 arranged by the dispenser 230 (second supply unit) are measured by the alignment scope 232 (second measurement unit). If the relative positions measured here are different from those in the replica manufacturing apparatus 100 shown on the left view, the substrate stage 220 is driven to move the substrate 40 such that the relative positions become the relative positions ΔX and ΔY in the replica manufacturing apparatus 100.

Accordingly, the positional relationship between the circuit pattern 12 and the imprint material 131 can be reproduced in the circuit pattern 32 and the imprint material 231.

(Control Operation of Imprint System)

Figure 2A:
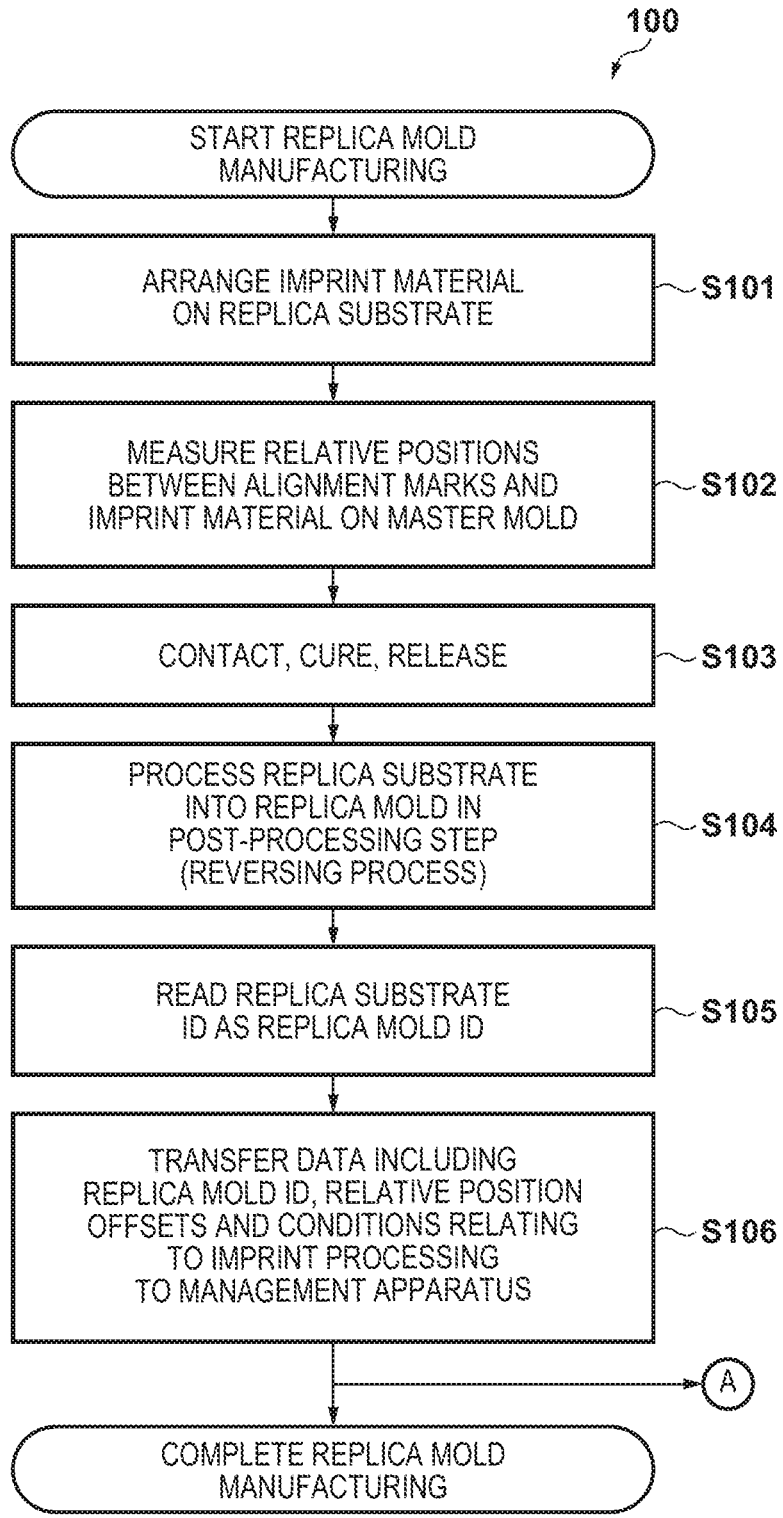
FIG. 2A is a flowchart for explaining the control operation of the imprint system according to the embodiment.

The control operation of the imprint system according to this embodiment will be described below with reference to the flowcharts of FIGS. 2A to 2C. In the replica manufacturing apparatus 100, the memory 162 of the control unit 160 stores preset conditions concerning imprint processing.

In the replica manufacturing apparatus 100, in step S101, the control unit 160 controls the dispenser 130 in accordance with the arrangement conditions stored in the memory 162 to arrange the imprint material 131 on the replica substrate 20. In step S102, the control unit 160 causes the alignment scope 132 to measure the relative positions between the alignment marks 11 on the mold 10 and the imprint material 131 on the replica substrate 20. The measured values of the relative positions are stored as relative position offsets in the memory 162.

Next, in step S103, the control unit 160 controls the imprint head 110 in accordance with the contact conditions stored in the memory 162 to bring the mold 10 into contact with the imprint material 131 on the replica substrate 20. At this time, alignment between the mold 10 and the replica substrate 20 is also performed using the alignment scope 132. The control unit 160 controls the light source unit 140 in accordance with the irradiation conditions stored in the memory 162 and causes it to irradiate the imprint material 131 with light, thereby curing the imprint material 131. After the imprint material 131 is cured, the control unit 160 controls the imprint head 110 in accordance with the mold release conditions stored in the memory 162 to perform mold release to separate the mold 10 from the imprint material 131.

In step S104, the replica substrate 20 undergoes etching in post-processing and is processed using the reversing process into a replica mold on which the same circuit pattern as the mold 10 is formed.

In step S105, using the reading unit 151, the control unit 160 reads a replica substrate ID 50 formed in advance on the replica substrate 20 as a replica mold ID. In step S106, the control unit 160 transfers data including the relative position offsets and the conditions concerning imprint processing to the management apparatus 300 in association with the replica mold ID. The conditions concerning imprint processing can include the arrangement conditions, the contact conditions, the irradiation conditions, the mold release conditions, the wavelength selection conditions, the filter selection conditions, and the slit setting conditions as described above.

The management apparatus 300 stores, in the memory 302, the data received from the replica manufacturing apparatus 100 (step S301).

The imprint apparatus 200 executes imprint processing using, as the mold 30, the replica mold manufactured by the replica manufacturing apparatus 100. First, in step S201, using the reading unit 251, the control unit 260 reads the replica mold ID 50 of the mold 30 held by the imprint head 210. After that, the control unit 260 issues request data including the read replica mold ID 50 to the management apparatus 300. Upon receiving the request data, the management apparatus 300 transmits, to the imprint apparatus 200, data including an ID that matches the replica mold ID 50 included in the request data (step S302). The imprint apparatus 200 receives the data and acquires the conditions concerning imprint processing (step S202). These acquired conditions are stored in the memory 262.

In step S203, the control unit 260 controls the dispenser 230 in accordance with the acquired arrangement conditions to arrange the imprint material 231 on the substrate 40. In step S204, the control unit 260 causes the alignment scope 232 to measure the relative positions between the alignment marks 31 on the mold 30 and the imprint material 231 on the substrate 40. In step S205, the control unit 260 drives the substrate stage 220 based on the relative positions obtained by the measurement and the relative positions acquired in step S202. For example, the control unit 260 drives the substrate stage 220 such that the distances between the relative positions measured by the alignment scope 230 and the relative positions acquired in step S202 fall within an allowable range.

After that, in step S206, the control unit 260 controls the imprint head 210 in accordance with the contact conditions acquired in step S202 and stored in the memory 262 to bring the mold 30 into contact with the imprint material 231 on the substrate 40. At this time, alignment between the mold 30 and the substrate 40 is also performed using the alignment scope 232. The control unit 260 controls the curing unit 24 in accordance with the irradiation conditions acquired in step S202 and stored in the memory 262 and causes it to irradiate the imprint material 231 with light, thereby curing the imprint material 231. After the imprint material 231 is cured, the control unit 260 controls the imprint head 210 in accordance with the mold release conditions acquired in step S202 and stored in the memory 262 to perform mold release to separate the mold 30 from the imprint material 231.

According to the above-described processing, as the conditions concerning imprint processing for the mold 30 that is the replica mold in the imprint apparatus 200, the conditions concerning imprint processing at the time of replica mold manufacturing in the replica manufacturing apparatus 100 are diverted. Accordingly, the circuit pattern formed when the circuit pattern is formed on the replica substrate 20 while suppressing unfilled defects can be reproduced on the substrate 40.

Note that the alignment marks 11 of the master mold (mold 10) can be transferred to the replica substrate 20 at the same time as the circuit pattern. In this case, as the alignment marks 31 of the replica mold (mold 30), marks formed by transferring the alignment marks 11 of the master mold can be used. For this reason, it is possible to adjust the arrangement position of the imprint material without any problem caused by the drawing errors of the circuit pattern and the alignment marks.

Note that the arrangement conditions according to this embodiment can include not only the arrangement position of the imprint material on the substrate but also the information of the arrangement amount of the imprint material, as described above. For example, the information of the arrangement amount of the imprint material for each nozzle of the dispenser 130 is stored in the memory 162, and the imprint apparatus 200 is notified of the information. Ono the side of the imprint apparatus 200, the control unit 260 calculates the difference from the information of the arrangement amount of the imprint material for each nozzle of the dispenser 230 and corrects the arrangement amount. This can adjust the arrangement amount of the imprint material and reproduce the film thickness of the pattern formed on the substrate by the imprint material without considering the difference in the arrangement amount of the imprint material between the apparatuses. For example, in a piezo-type nozzle, the arrangement amount of the imprint material can be corrected by a voltage value or opening time when extruding the imprint material.

(Consideration of Offsets Unique to Apparatuses)

A case in which each of the replica manufacturing apparatus 100 and the imprint apparatus 200 has a unique offset will be described below. A case in which each of the dispenser 130 of the replica manufacturing apparatus 100 and the dispenser 230 of the imprint apparatus 200 has an attachment position offset will be described as an example. Let $\Delta X_{130}$ be the attachment position offset of the dispenser 130 of the replica manufacturing apparatus 100. Also, let $\Delta X_{230}$ be the attachment position offset of the dispenser 230 of the imprint apparatus 200. When the reference is made to match in advance between the apparatuses using a mold serving as a reference, the difference between the apparatuses can be canceled. When the pattern error of the reference mold is $\Delta X_{m0}$, a relative position $\Delta X_{replica\ ref}$ between the alignment mark 11 and the imprint material 131 measured by the replica manufacturing apparatus 100 using the reference mold is given by $$\Delta X_{replica\ ref} = \Delta X_{m0} + \Delta X_{130}$$

Similarly, when the pattern error of the mold used in actual device manufacturing is $\Delta X_{m1}$, $\Delta X$ in the replica manufacturing apparatus 100 shown in FIG. 3 when the mold to be used in the actual device manufacturing is used is given by $$\Delta X = \Delta X_{m1} + \Delta X_{130}$$

When the difference between the measurement result $\Delta X_{replica}$ ref of the reference mold and the measurement result $\Delta X$ of the mold used in actual device manufacturing is calculated, a result $\Delta X_{offset}$ excluding the attachment offset $\Delta X_{130}$ unique to the apparatus can be obtained by $$\Delta X_{offset} = \Delta X - \Delta X_{replica\ ref} = (\Delta X_{m1} + \Delta X_{130}) - (\Delta X_{m0} + \Delta X_{130}) = \Delta X_{m1} - \Delta X_{m0}$$

Next, a relative position $\Delta X_{imprint\ ref}$ between the alignment mark 31 and the imprint material 231 measured in the imprint apparatus 200 using the reference mold is given by $$\Delta X_{imprint\ ref} = \Delta X_{m0} + \Delta X_{230}$$

Here, when using the mold used in actual device manufacturing, $\Delta X_{offset}$ calculated in the replica manufacturing apparatus 100 is added to $\Delta X_{imprint\ ref}$. Accordingly, it is possible to obtain the target position of $\Delta X$ in the imprint apparatus 200 shown in FIG. 3 in consideration of only the pattern error $\Delta X_{m1}$ of the mold used in device manufacturing and the attachment position offset $\Delta X_{230}$ of the dispenser 230 of the imprint apparatus 200.

$$\Delta X = \Delta X_{imprint\ ref} + \Delta X_{offset} = (\Delta X_{m0} + \Delta X_{230}) - (\Delta X_{m1} - \Delta X_{m0}) = \Delta X_{m1} + \Delta X_{230}$$

Here, $\Delta X$ has been described. The same correction can be done for $\Delta Y$ as well, and a description thereof will be omitted. The offset of the attachment position of the dispenser has been described here. However, the present invention is not limited to this. The difference between the apparatuses can be canceled even for the discharge position of the dispenser, the measurement position of the alignment scope, the reference position of the stage, and the like by making the reference match between the apparatuses using the reference mold.

(Diversion of Control Profile)

As a modification, an example in which the control profile at the time of imprint processing is diverted as the conditions concerning imprint processing will be described. After the imprint material 131 is arranged on the replica substrate 20, the replica manufacturing apparatus 100 brings the mold 10 that is the master mold into contact with the imprint material 131. At this time, the replica manufacturing apparatus 100 deforms the pattern surface of the mold 10 into a convex shape toward the replica substrate 20 and then brings the mold 10 into contact with the imprint material 131 on the replica substrate 20. In this case, a pattern surface 10a of the mold 10 comes into contact with the imprint material 131 outward from the center. This suppresses confinement of bubbles between the mold 10 and the imprint material 131. When performing mold release, reversely, the mold is gradually separated from the imprint material 131 from the outer portion toward the center of the pattern surface of the mold 10, thereby preventing the pattern of the imprint material formed on the replica substrate 20 from chipping. The state at this time is captured by the image capturing unit 121.

At the time of imprint processing, the replica manufacturing apparatus 100 transfers, to the management apparatus 300, management data including the replica substrate ID 50 and the measurement result (control profile) of the contact state between the mold 10 and the imprint material 131 based on the image captured by the image capturing unit 121.

Figure 4:
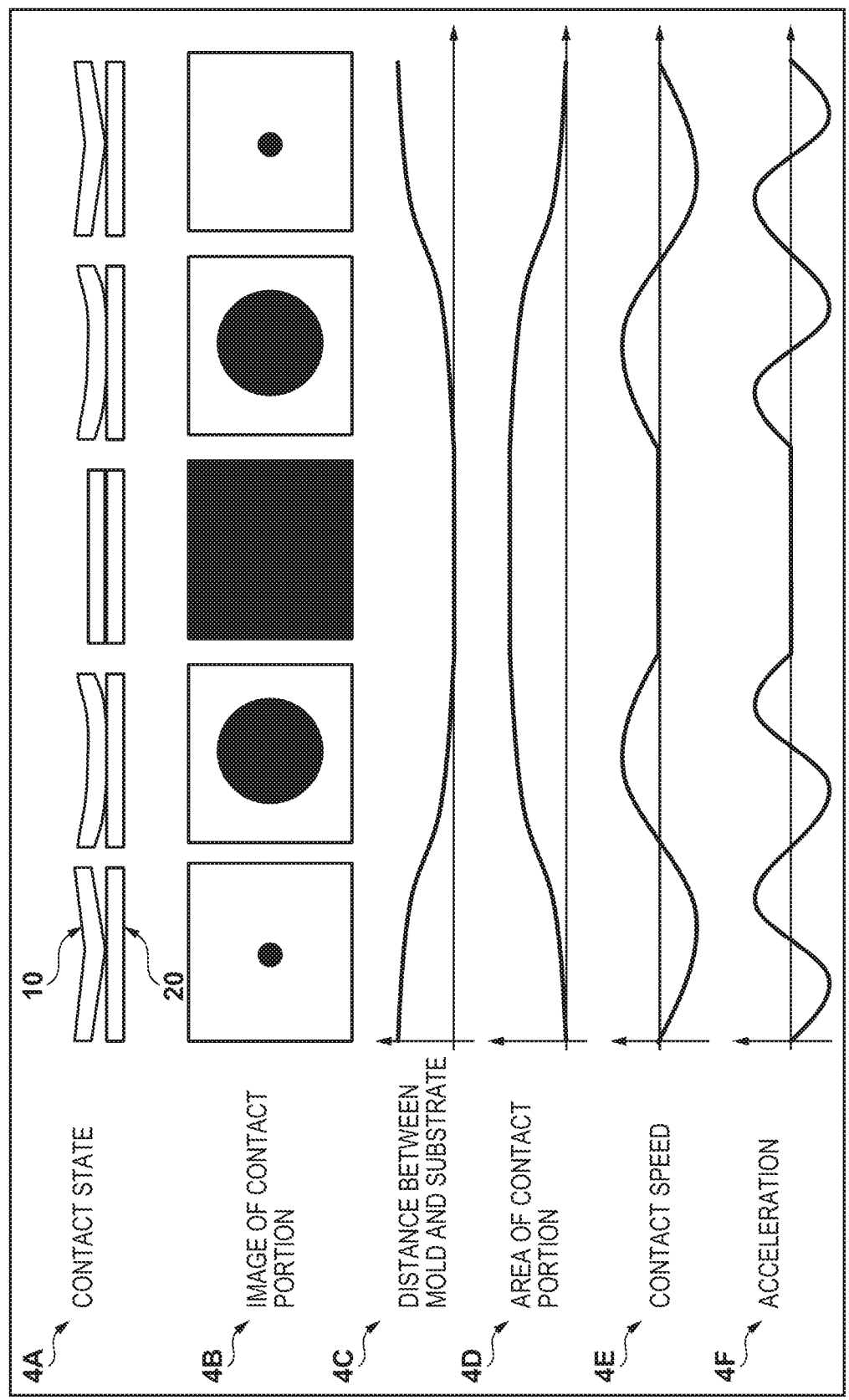
FIG. 4 is a view showing a contact state between a mold and an imprint material.

FIG. 4 shows the conceptual view of the contact state. A contact state 4A represents a state transition in which the mold 10 is brought into contact with the imprint material 131 on the replica substrate 20 while being deformed as described above, and after that, mold release is performed. An image 4B of the contact portion is an image representing the state transition of a portion where the mold 10 and the replica substrate 20 are in contact via the imprint material 131 along with the contact state 4A, which is measured based on the image captured by the image capturing unit 121. A distance 4C between the mold and the substrate represents a change in the position of the mold 10 (the distance between the mold 10 and the replica substrate 20) by the imprint head 110 along with the contact state 4A. An area 4D of the contact portion represents a change in the area of the portion where the mold 10 and the replica substrate 20 are in contact via the imprint material 131 along with the state transition of the image 4B of the contact portion. A contact speed 4E represents a change in the moving speed of the mold 10 by the imprint head 110 along with the state transition of the distance 4C between the mold and the substrate. An acceleration 4F represents a change in the moving acceleration of the mold 10 by the imprint head 110 along with the state transition of the distance 4C between the mold and the substrate. The control profile included in the management data may be the image 4B itself of the contact portion or may be the value of the area 4D of the contact portion.

In the imprint apparatus 200 as well, the image capturing unit 221 observes the contact state when bringing the mold 30 into contact with the imprint material 231 arranged on the substrate 40 and performing mold release. The imprint apparatus 200 reads the ID 50 formed on the mold 30 by the reading unit 251, and acquires, from the management apparatus 300, a control profile as the conditions concerning imprint processing according to the read ID. In the imprint apparatus 200 as well, the pattern surface of the mold 30 comes into contact with the imprint material 231 outward from the center. This suppresses confinement of bubbles between the mold 30 and the imprint material 231. When performing mold release, reversely, the pattern surface of the mold 30 gradually separates from the imprint material 231 from the outer portion toward the center, thereby preventing the pattern of the imprint material formed on the substrate 40 from chipping. The state at this time is captured by the image capturing unit 221. The data of the captured result is compared with the management data (corresponding to the image 4B of the contact portion or the area 4D of the contact portion) stored in the management apparatus 300. If the data are different as the result of comparison, the deformation amount of the mold 30 or the driving speed of the driving unit (for example, the imprint head 210) that changes the relative position between the mold 30 and the substrate 40 is corrected. Accordingly, the contact and release states of the mold and the defect suppression accuracy in imprint processing at the time of replica substrate manufacturing can be reproduced in imprint processing at the time of device manufacturing.

In addition, as for the conditions concerning imprint processing described above, the pieces of information of the distance 4C, the speed 4E, and/or the acceleration 4F may be used in place of the information concerning the contact state. When the driving conditions of the imprint heads 110 and 210 are made to match, the contact speeds of the mold to the imprint material can be made to match between the replica mold manufacturing and the device manufacturing. Accordingly, the conditions concerning imprint processing optimized at the time of replica manufacturing can easily be reproduced at the time of device manufacturing.

In addition, the conditions concerning imprint processing may be the information of the driving force of the driving unit. For example, the thrust of the driving shaft of the imprint head 110 at the time of contact and mold release, for example, the current value of the actuator is monitored and stored in the memory 162 of the control unit 160, and the control unit 260 is notified of it. This allows the imprint head 210 to feed back the notified current value to the thrust in driving, and the stress applied to the pattern portion of the mold can be made to match between replica mold manufacturing and device manufacturing. As a result, the contact and mold release conditions optimized at the time of replica mold manufacturing can easily be reproduced at the time of device manufacturing.

In addition, the conditions concerning imprint processing may be the information of the posture of the mold. A displacement gauge configured to measure the tilt or gap of the surface of a substrate is provided in place of each of the image capturing units 121 and 221. The tilts of the pattern surface and the surface on which the imprint material is arranged in contact and mold release at the time of replica mold manufacturing are stored in the memory 162 of the control unit 160, and the control unit 260 is notified of them. The pieces of information of the notified tilts are fed back at the time of device manufacturing. Accordingly, the posture in the contact and mold release can be made to match between replica mold manufacturing and device manufacturing. As a result, the film thickness unevenness of the imprint material optimized at the time of replica mold manufacturing or the stress conditions to the pattern at the time of mold release can easily be reproduced at the time of device manufacturing.

(Application to Cluster Apparatus)

Figure 5:
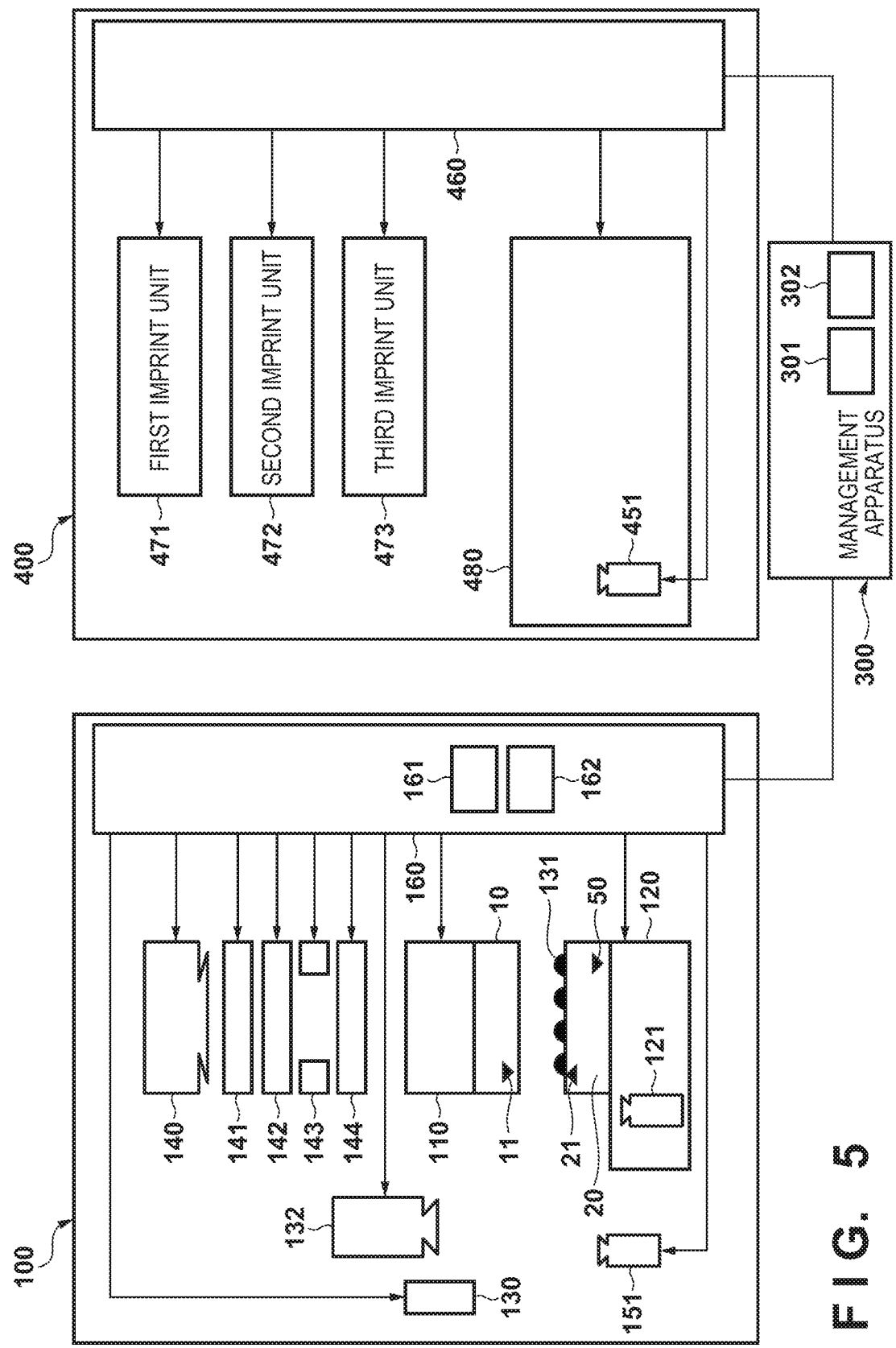
FIG. 5 is a block diagram showing the arrangement of an imprint system with a cluster arrangement.

FIG. 5 is a block diagram showing the arrangement of an imprint system with a cluster arrangement. The arrangements of the replica manufacturing apparatus 100 and the management apparatus 300 shown in FIG. 5 are the same as in FIG. 1, and a description thereof will be omitted. In FIG. 5, a cluster apparatus 400 including a plurality of imprint units each having the same arrangement as the imprint apparatus 200 in FIG. 1 is provided.

The cluster apparatus 400 includes a plurality of imprint units including a first imprint unit 471, a second imprint unit 472, and a third imprint unit 473, a reading unit 451 that reads the ID of a mold, a conveyance mechanism 480, and a control unit 460. Each of the first imprint unit 471, the second imprint unit 472, and the third imprint unit 473 has the same arrangement as the imprint apparatus 200 shown in FIG. 1. The conveyance mechanism 480 conveys a mold loaded into the cluster apparatus 400 to an imprint unit designated by the control unit 460.

The management apparatus 300 can distribute data including conditions concerning imprint processing to each imprint apparatus. More specifically, when a mold (replica template) is loaded into the cluster apparatus 400, the control unit 460 reads the ID of the mold by the reading unit 451. The control unit 460 requests data corresponding to the read ID of the management apparatus 300, and receives the data from the management apparatus 300. The control unit 460 controls the conveyance mechanism 480 to convey the replica mold to the target imprint unit, and also transmits the received data to the imprint unit. Each imprint unit executes imprint processing in accordance with the received data, as described above. Accordingly, in each imprint unit, a circuit pattern formed when the circuit pattern is formed on the replica substrate in the replica manufacturing apparatus 100 can be reproduced on a device substrate.

Additionally, in a case in which the plurality of imprint units have unique offsets, the reference is made to match in advance between the replica manufacturing apparatus 100 and each imprint unit using a reference mold, as described above, thereby canceling the difference between the apparatuses.

<Embodiment of Article Manufacturing Method>

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

An article manufacturing method of manufacturing an article will be described next with reference to FIG. 6. In step SA, a substrate 1z such as a silicon substrate with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

In step SB, a side of a mold 4z for imprint with an uneven pattern is directed to and caused to face the imprint material 3z on the substrate. In step SC, the substrate 1 to which the imprint material 3z is applied is brought into contact with the mold 4z, and a pressure is applied. The gap between the mold 4z and the processed material 2z is filled with the imprint material 3z. In this state, when the imprint material 3z is irradiated with energy for curing via the mold 4z, the imprint material 3z is cured.

In step SD, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

In step SE, when etching is performed using the pattern of the cured product as an etching resistant pattern, a portion of the surface of the processed material 2z where the cured product does not exist or remains thin is removed to form grooves 5z. In step SF, when the pattern of the cured product is removed, an article with the grooves 5z formed in the surface of the processed material 2z can be obtained. Here, the pattern of the cured product is removed. However, the pattern of the cured product may be used, without being removed, as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:
1. An imprint system comprising:
   a replica manufacturing apparatus configured to manufacture a replica mold using a master mold;
   an imprint apparatus configured to perform imprint processing of forming a pattern of an imprint material on a substrate using the replica mold; and
   a management apparatus communicably connected to the replica manufacturing apparatus and the imprint apparatus, wherein the replica manufacturing apparatus comprises a supply unit configured to supply an imprint material onto a replica substrate and is configured to perform imprint processing of forming a pattern of the imprint material on the replica substrate using the master mold, process the replica substrate with the formed pattern to manufacture the replica mold, and transfer data of a condition concerning the imprint processing to the management apparatus, wherein the condition includes an arrangement condition that defines supply of the imprint material onto the replica substrate by the supply unit, and wherein the imprint apparatus is configured to acquire the data from the management apparatus, and perform the imprint processing of forming the pattern of the imprint material on the substrate using the replica mold in accordance with the condition included in the acquired data.

2. The imprint system according to claim 1, wherein the replica manufacturing apparatus further comprises a first reading unit configured to read identification information formed on the replica substrate, and is configured to include the condition in the data in association with the identification information read by the first reading unit and transfer the data to the management apparatus, wherein the imprint apparatus comprises a second reading unit configured to read identification information formed on the replica mold, and is configured to issue, to the management apparatus, request data including the identification information read by the second reading unit, and wherein the management apparatus is configured to transmit data including identification information that matches the identification information included in the received request data to the imprint apparatus.

3. The imprint system according to claim 1, wherein the replica manufacturing apparatus further comprises a first measurement unit configured to measure a relative position between an alignment mark formed on the master mold and the imprint material supplied onto the replica substrate by the supply unit, and is configured to include the relative position measured by the first measurement unit in the data, and wherein the imprint apparatus further comprises:
a substrate stage configured to hold the substrate and move;
a second supply unit configured to supply the imprint material onto the replica substrate;
a second measurement unit configured to measure a relative position between an alignment mark formed on the replica mold and the imprint material supplied onto the substrate by the second supply unit; and
a control unit configured to control a position of the substrate stage based on the relative position included in the data and the relative position measured by the second measurement unit.

4. The imprint system according to claim 3, wherein the control unit is configured to control the position of the substrate stage such that a distance between the relative position measured by the second measurement unit and the relative position included in the data falls within an allowable range.

5. The imprint system according to claim 1, wherein the imprint apparatus further comprises a plurality of imprint apparatuses, and the management apparatus is configured to distribute the data to each imprint apparatus of the plurality of imprint apparatuses.

6. The imprint system according to claim 1, wherein the replica manufacturing apparatus further comprises a driving unit configured to change a relative position between the master mold and the replica substrate, and wherein the condition further includes a contact condition that defines an operation of the driving unit when brining the master mold into contact with the imprint material on the replica substrate.

7. The imprint system according to claim 6, wherein the replica manufacturing apparatus further comprises a curing unit configured to cure the imprint material on the replica substrate, and wherein the condition further includes a curing condition that defines an operation of the curing unit when curing the imprint material after the master mold is brought into contact with the imprint material on the replica substrate by the driving unit.

8. The imprint system according to claim 7, wherein the condition further includes a mold release condition that defines the operation of the driving unit when performing mold release of separating the master mold from the imprint material cured by the curing unit.

9. The imprint system according to claim 7, wherein the curing unit comprises:
a light source:
a plurality of wavelength filters configured to pass light beams of wavelengths different from each other; and
a wavelength selection unit configured to arrange a wavelength filter selected from the plurality of wavelength filters into an optical path between the light source and the master mold, and
the condition further includes a wavelength selection condition in the wavelength selection unit.

10. The imprint system according to claim 8, wherein the replica manufacturing apparatus further comprises an image capturing unit configured to capture a state after the master mold is brought into contact with the imprint material on the replica substrate by the driving unit until the mold release is performed, wherein the data includes an image captured by the image capturing unit, and wherein the imprint apparatus is configured to perform the imprint processing based on the image included in the data.

11. An article manufacturing method of manufacturing an article, comprising:

causing a replica manufacturing apparatus to supply an imprint material onto a replica substrate from a supply unit, perform imprint processing of forming a pattern of the imprint material on the replica substrate using a master mold, and process the replica substrate with the formed pattern to manufacture a replica mold;

causing the replica manufacturing apparatus to transfer data of a condition concerning the imprint processing from the replica manufacturing apparatus to a management apparatus, the condition including an arrangement condition that defines supply of the imprint material onto the replica substrate by the supply unit;

causing an imprint apparatus to acquire the data from the management apparatus;

causing the imprint apparatus to form a pattern of an imprint material on a substrate using the replica mold in accordance with the condition concerning the imprint processing, which is included in the acquired data; and processing the substrate with the formed pattern, wherein the article is manufactured from the processed substrate.

\* \* \* \* \*